United States Patent [19]

Speeter

[11] Patent Number: 5,237,879
[45] Date of Patent: Aug. 24, 1993

[54] APPARATUS FOR DYNAMICALLY VARYING THE RESOLUTION OF A TACTILE SENSOR ARRAY

[75] Inventor: Thomas H. Speeter, Freehold, N.J.

[73] Assignee: AT&T Bell Laboratories, Murray Hill, N.J.

[21] Appl. No.: 775,881

[22] Filed: Oct. 11, 1991

[51] Int. Cl.$^5$ .................. G01D 7/02; H01C 10/10
[52] U.S. Cl. .................. 73/862.041; 73/862.046; 73/865.7; 340/712
[58] Field of Search .............. 73/DIG. 4, 862.046, 73/862.68, 865.7, 862.041, 862.042, 862.043, 862.044, 727; 340/712; 341/34; 178/18, 19; 901/33

[56] References Cited

U.S. PATENT DOCUMENTS

| | | | |
|---|---|---|---|
| 4,219,846 | 8/1980 | Auphan | 73/626 |
| 4,481,815 | 11/1984 | Overton | 73/865.7 |
| 4,526,043 | 7/1985 | Boie et al. | 73/862.046 |
| 4,634,917 | 1/1987 | Dvorsky et al. | 310/328 |
| 4,640,137 | 2/1987 | Trull et al. | 73/862.046 |
| 4,795,998 | 1/1989 | Dunbar et al. | 338/208 |
| 4,856,993 | 8/1989 | Maness et al. | 73/865.7 |
| 5,010,772 | 4/1991 | Bourland et al. | 73/862.046 |
| 5,010,774 | 4/1991 | Kikuo et al. | 73/862.046 |

OTHER PUBLICATIONS

R. A. Boie, "Capacitive Impedance Readout Tactile Image Sensor," IEEE 1984 International Conf. on Robotics, CH2008, 1984, pp. 370-378.

R. S. Fearing et al., "A Tactile Sensing Finger Tip for a Dextrous Hand," 5th SPIE Intelligent Robotics and Computer Vision, Cambridge, Mass., Oct. 28-30, 1986, pp. 1-10.

Interlink Electronics Literature, "Touch the Future... Through Force Sensing Resistors from Interlink Electronics," Interlink Electronics, 1110 Mark Avenue, Carpinteria, Calif. 93013, pp. 1-5.

Primary Examiner—Michael T. Razavi
Assistant Examiner—Tim May
Attorney, Agent, or Firm—Gerard A. De Blasi

[57] ABSTRACT

Methods and apparatus are provided for dynamically varying the resolution of a tactile sensor array. Sensing elements in the array are selectively coupled to reduce the resolution of the array, thereby permitting very fast sampling rates with low resolution, while retaining the ability to sample with higher resolution at lower sampling rates. Sensing elements may be coupled, for example, through the sensor array addressing circuitry. The present invention permits a single sensor array to be used for both low and high resolution applications, thereby eliminating the need to change sensors between applications or to maintain several sets of sensor arrays.

12 Claims, 7 Drawing Sheets

APPARATUS FOR DYNAMICALLY VARYING THE RESOLUTION OF A TACTILE SENSOR ARRAY

BACKGROUND OF THE INVENTION

The present invention relates to tactile sensor arrays, and, more particularly, to methods and apparatus for dynamically varying the resolution of a piezoresistive or variable capacitance tactile sensor array.

Although tactile sensor arrays are known in the art, methods and apparatus for dynamically varying the resolution of such arrays are not yet available. Applications requiring varying levels of resolution at different stages of the application necessitate using a sensor array capable of producing the highest resolution that may be required for that application. In this case, at certain times, the high resolution array may produce far more data than are required, resulting in unnecessary data sampling and longer processing times. Sampling techniques which sample only selected pixels of an array to reduce data may be undesirable because they leave portions of the array "uncovered," by not using data from selected pixels.

Alternatively, sensing arrays of different resolution may be used at various stages of an application. However, changing the sensor array during an application may be impossible, or at least cumbersome and inefficient. This alternative also involves the expense of maintaining two or more sets of arrays. There also is a risk that sensor arrays may be damaged by repeated installation and removal, for example, while installing the array on the end effector of a robot arm.

Therefore, it would be desirable to provide methods and apparatus for varying the resolution of a single tactile sensing array, so that the array need not be replaced when varying levels of resolution are required. It also would be desirable to provide methods and apparatus which permit the number of pixels of information output from the sensing array to be dynamically varied for a given application of the array, so that information can be processed at speeds commensurate with the resolution required for the desired application.

SUMMARY OF THE INVENTION

These and other desirable features are provided in accordance with the principles of the invention by providing circuitry which selectively couples sensing elements of a sensor array so that only a single data output is produced when force is applied to one or more predetermined sensing elements. Dynamically varying the resolution of the sensor array in this manner permits sampling the array at very fast sampling rates with low resolution, while retaining the ability to sample with higher precision at lower sampling rates, and maintaining complete coverage of the sensitized area. A single sensor array can be used for both low and high resolution application, thereby eliminating the need to change sensors between applications or maintain several sets of sensing arrays.

In a preferred embodiment of the present invention, resolution control circuitry is coupled to circuitry for addressing sensing elements in the sensor array. The resolution control circuitry operates to address several sensors in parallel, thereby combining the resistance or capacitance of those sensors in parallel. This reduces the number of sensors to be sampled, and therefore permits increasing the sampling rate.

The resolution control circuitry preferably can operate in a "reset" state, or can be actuated. When the resolution control circuitry is reset, the array produces data at full resolution. In a preferred embodiment, each time the resolution control circuitry is actuated, the resolution of a row or column (or both) of the array is reduced by a power of two. The row and column addressing circuitry preferably are independent of one another, permitting various combinations of sampling speed and resolution for a given tactile sensing array.

BRIEF DESCRIPTION OF THE DRAWING

The above and other advantages of the invention will be apparent upon consideration of the following detailed description, taken in conjunction with the accompanying drawing, in which like reference numbers refer to like parts throughout, and in which.

DETAILED DESCRIPTION

Figure 1:
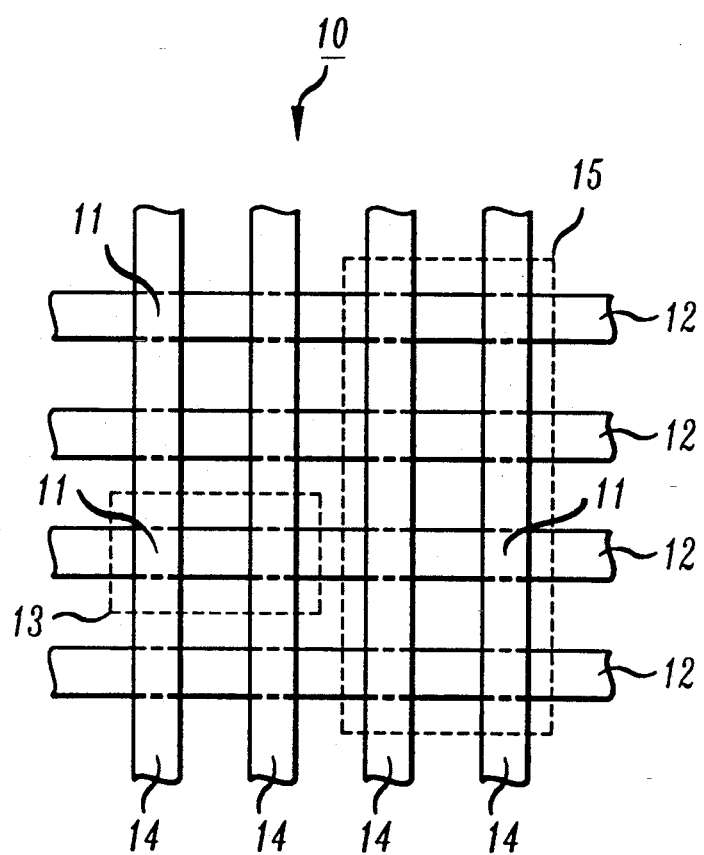
FIG. 1 is a schematic diagram of a sensor array suitable for use with the present invention.

Referring now to the drawings, FIG. 1 shows an illustrative example of a piezoresistive sensor array 10 suitable for use in accordance with the present invention. Sensor array 10 includes several separately accessible sensing elements 11 formed by the intersection of parallel rows 12 and parallel columns 14. Columns 14 are overlaid on rows 12, preferably oriented such that the columns are perpendicular to the rows, to form array 10. Sensors suitable for use with this invention are commercially available from Interlink Electronics, Carpinteria, Calif. 93013.

Each of sensing elements 11 typically outputs a pixel (or taxel) of data when accessed. However, in accordance with this invention, individual sensing elements may be grouped together with other sensing elements, as shown in phantom by boxes 13 and 15. The group of sensing elements provide a single data output whenever a force is applied to any sensing element within the group, thus reducing the resolution of sensor array 10. Sensing elements 11 may be formed into small groups of two elements (e.g., as shown in box 13), moderately-sizes groups (e.g., as shown in box 15), or large groups (not shown). Small groups of sensing elements providing only a slight reduction in resolution. Large groups (such as combining all sensing elements into a single group as a 1×1 array) provide a large reduction in resolution.

Array 10 typically may include sixteen rows and sixteen columns (a 16×16 array), although one of ordinary skill in the art will readily appreciate that arrays of other dimensionality may be used in accordance with this invention. The resolution-varying circuitry of the present invention can be used to dynamically vary the resolution of array 10, such that the array becomes, for example, a 16×8, 16×4, 8×8, 2×2, or 1×1 array.

In a preferred embodiment, each sensing element 11 is selectable by now and column address lines. The conductive material forming the sensing elements acts as a variable resistance, which changes as force is applied to an outer surface of sensor array 10. One skilled in the art will appreciate that other types of sensors, such as a variable capacitance array (using an AC input voltage), will function in a similar manner. However, for brevity, the invention will be described only in the context of a piezoresistive array. The normal force applied to any individual sensor can be determined by measuring this resistance. Force applied to an outer of surface of sensor array 10 will reduce the resistance between a row and a column, and will provide a conduction path proportional to the applied normal force.

In constructing sensor array 10, an anisotropic material (not shown) can be inserted between two portions of the sensor, to better insulate rows 12 from columns 14. Anisotropic material conducts electricity in only one direction, namely, perpendicular to the plane of the material. Inserting an anisotropic material between the conductive elements of sensor array 10 sets a mechanical threshold, thereby reducing noise, and reduces abrasion due to rubbing of the two halves of the sensor array. Material suitable for use in accordance with this invention includes Elastomer Conductive Polymer Interconnect (ECPI) (TM), which is commercially available from AT&T Microelectronics, Allentown, Pa. 18103.

Figure 2:
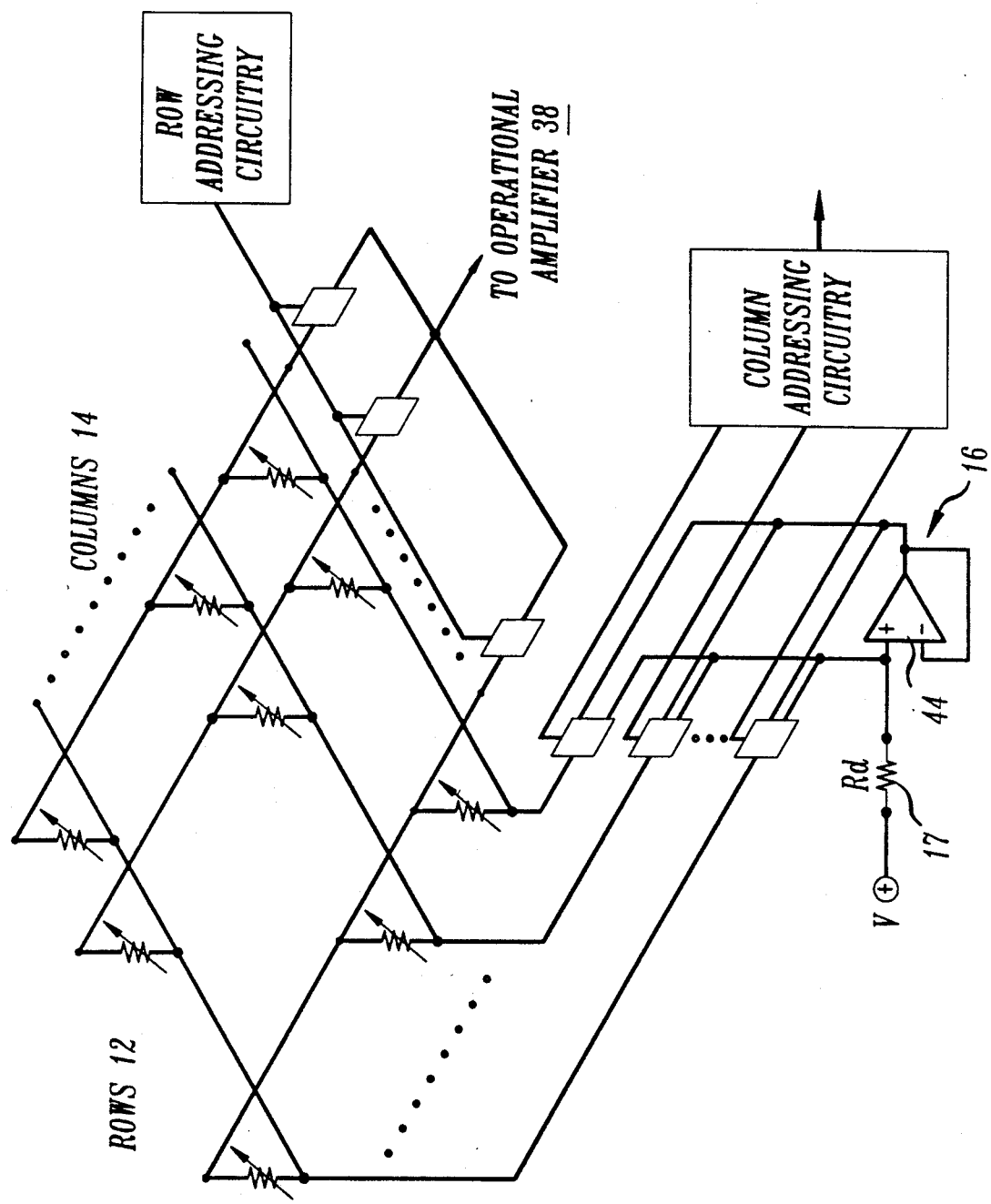
FIG. 2 is a partial schematic diagram of a sensor array and sensor isolation circuitry in accordance with the present invention.

Referring to FIG. 2, sensor array 10 is shown coupled to sensing element isolation circuitry 16. Sensing element isolation circuitry 16 eliminates current flow from undesirable (parallel) electrical paths in the sensor array. When a sensing element is selected (i.e., addressed) via row and column address lines, as described below, a voltage is applied to the sensing element. An output voltage is fed back to all columns except the one selected, thereby clamping the non-addressed columns at the same voltage. Clamping each column at the same voltage in this manner eliminates all undesirable paths, because current cannot flow from one column to another. After a short wait for the feedback loop to settle, a voltage appearing across an output resistor 17 (when using the voltage divider technique described below) can be used as a measure of the resistance of the selected sensing element. The resistance of the sensing element can then be used to calculate the normal force on that element, using techniques well-known to those skilled in the art.

Figure 3:
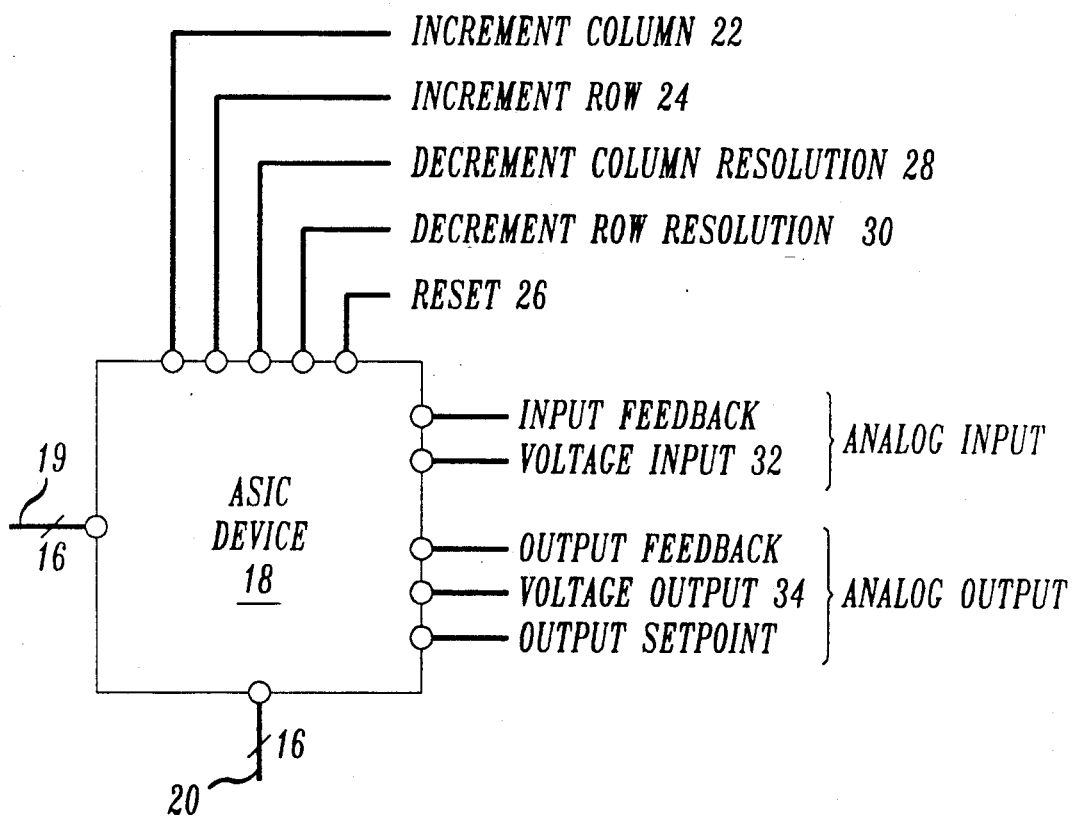
FIG. 3 is a block diagram of an integrated circuit made according to the principles of the present invention.

Referring to FIG. 3, in a preferred embodiment of the invention, the circuitry for addressing and controlling the resolution of the array is implemented as an application-specific integrated circuit (ASIC) 18. Although one skilled in the art will appreciate that discrete circuitry could be used to implement the invention, the invention will be described in the context of an ASIC.

The circuit of FIG. 3 includes sixteen sensor column input pins (designated generally by reference number 19) and sixteen sensor row input pins (designated generally by reference number 20). Each column input pin 19 is electrically coupled to a respective one of the sixteen sensor array columns. Likewise, each row input pin 20 is electrically coupled to a respective one of the sixteen sensor array rows. An "Increment Column" pin 22, an "Increment Row" pin 24, and a reset pin 26 are provided for addressing each sensing element of sensor array 10. Circuit 18 includes a "Decrement Column Resolution" pin 28 and a "Decrement Row Resolution" pin 30 for dynamically varying the column and row resolution, respectively, of sensor array 10. The circuitry also includes various analog input pins, such as a voltage input pin 32, a voltage output pin 34, and several additional pins for adjusting the input or output voltages.

Figure 4:
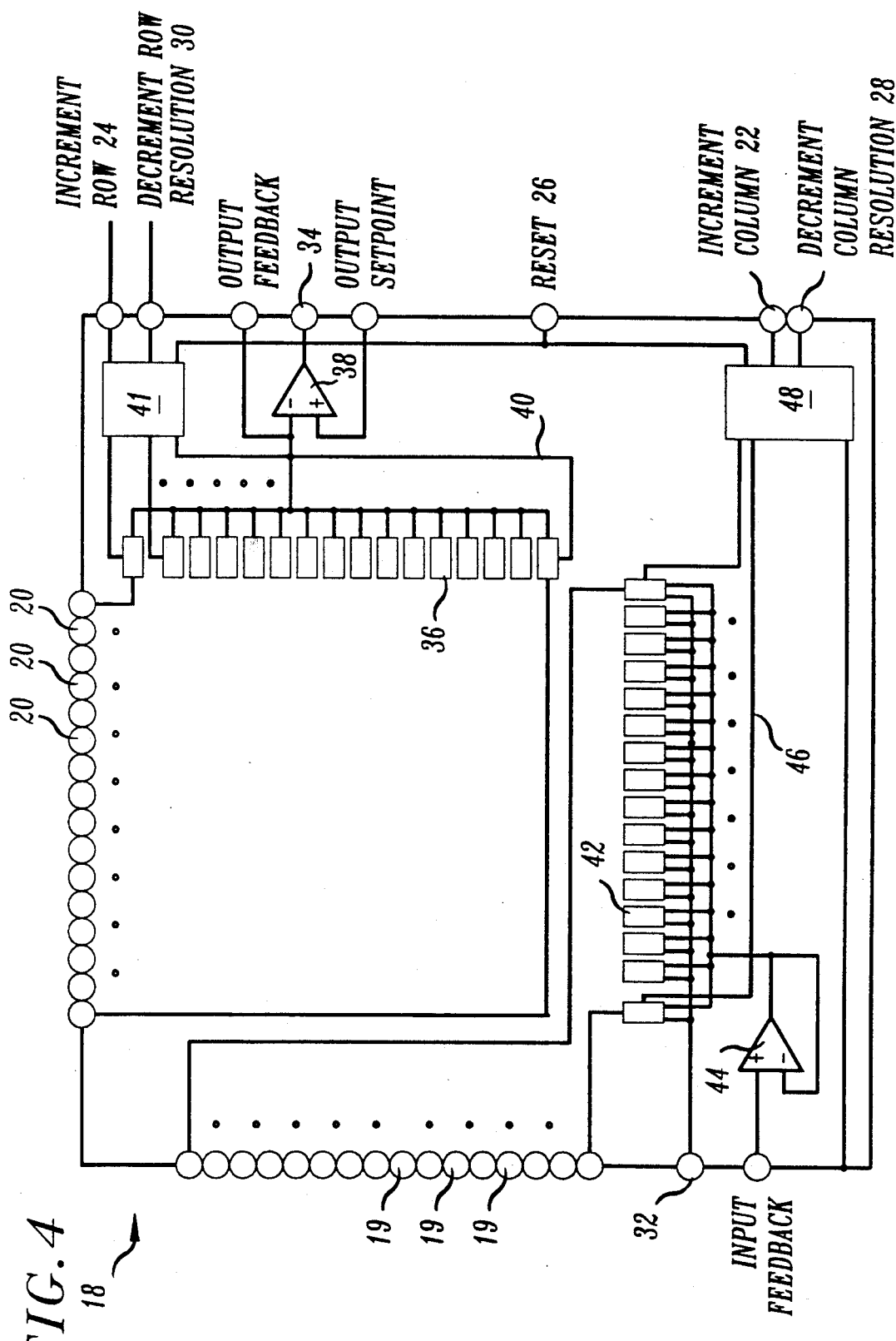
FIG. 4 is a partial schematic diagram of the circuitry of the integrated circuit of FIG. 3.

Referring now to FIG. 4, each of sensor row input pins 20 are coupled to a respective one of sixteen single pole, single throw (SPST) analog switches 36. Each of analog switches 36 is coupled to a respective output operational amplifier 38, and to control line 40 (which carries address information). The value of each of control lines 40 is determined by the row address and resolution control circuit 41 (shown in detail in FIG. 5).

Each of sensor column input pins 19 is coupled to a respective one of sixteen double pole, single throw (DPST) analog switches 42. A first pole is coupled to the voltage input pin 32. A second pole is coupled to sensing element isolation circuitry 16 (FIG. 2), which is implemented using an operational amplifier 44. The selection of either the first or second pole for a given analog switch 42 depends upon the value of the signal on control line 46 to that switch (which depends upon whether a sensing element in the column to which the switch is coupled is selected). The signal on control lines 46 are determined by the column address and resolution control circuitry 48 (see the related discussion, with reference to FIG. 5, below).

Figure 5:
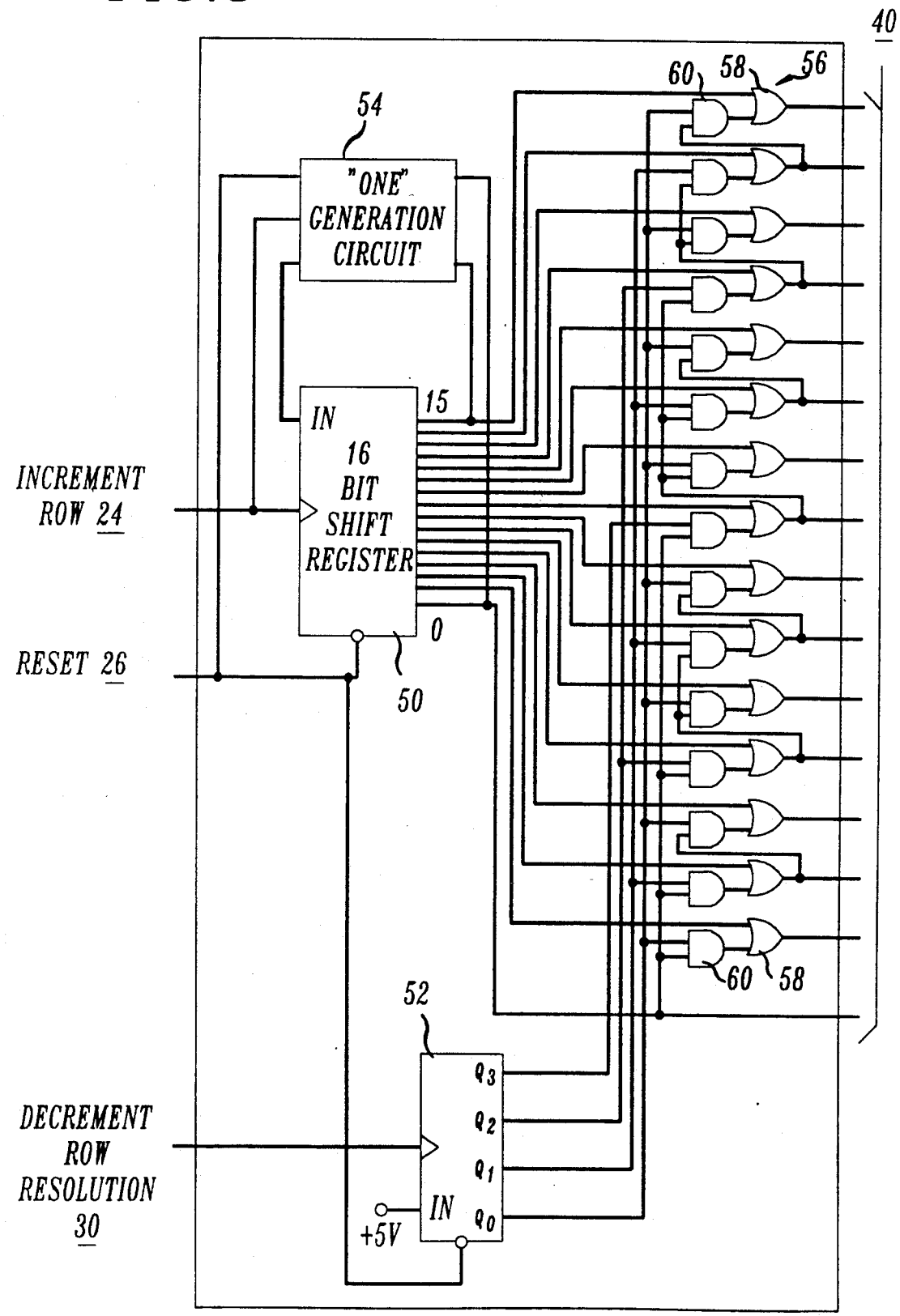
FIG. 5 is a schematic diagram of an illustrative embodiment of the row address and resolution control circuitry of FIG. 4.
Figure 6:
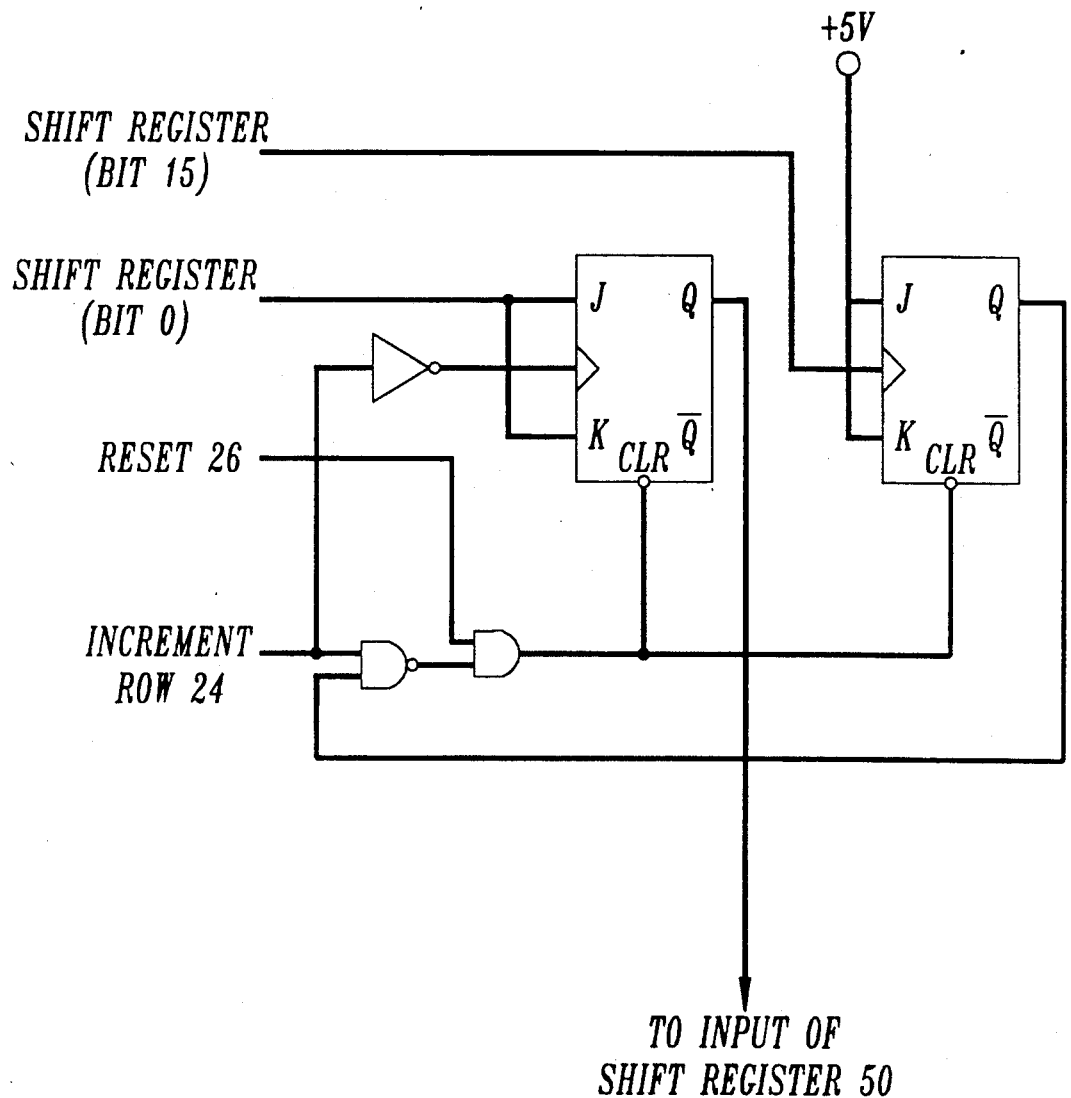
FIG. 6 is a schematic diagram of an illustrative embodiment of the "one" generation circuit of FIG. 5.

Referring now to FIG. 5, row address and resolution control circuitry 41 includes a 16-bit serial in/parallel out shift register 50, a 4-bit serial in/parallel out shift register 52, and combinational logic 56. A circuit 54 generates a value of logic one that is shifted through shift register 50 after register 50 is reset. FIG. 6 shows an illustrative embodiment of a circuit for implementing circuit 54 using two JK flip-flops and combinational logic.

The output of shift register 50 may be any of seventeen different values. For example, register 50 may output all zeros upon reset (corresponding to no row being selected), or any one of the sixteen lines may have a value of one (corresponding to one of the sixteen rows of sensor array 10 being selected). Clocking shift register 50 sequentially addresses each of the sixteen rows of sensor array 10. Shift register 50 is reset via reset pin 26 (see FIGS. 3 and 4). Once reset, register 50 can be clocked by asserting a signal on Increment Row pin 24. Increment Row pin 24 clocks a logic one value (generated by circuit 54) into position zero of shift register 50. Subsequent clocking of Increment Row pin 24 cycles a logic one through shift register 50.

Shift register 52 controls the resolution of sensor array 10 in accordance with the invention. When shift register 52 is reset, the row resolution of sensor array 10 is at its maximum value (i.e., 16). Subsequently clocking Decrement Row Resolution pin 30 reduces the row resolution by a power of two (for each clock pulse). The input to shift register 52 is tied to logic one, thus causing more ones to be output to combinational logic 56 with each clock of Decrement Row Resolution pin 30.

The output from shift registers 50 and 52 is input to combinational logic 56. In particular, each output line of shift register 50 is input to a respective one of sixteen OR gates 58, which, in turn, outputs to lines 40 to control SPST switches 36. Each line output from shift register 52 is input to one input of AND gates 60, which feed the second input to OR gates 58. In this manner, the array resolution control circuitry is tied directly to the array addressing circuitry.

Although FIG. 5 has been described in the context of row address and resolution control circuitry 41, the circuitry of FIG. 5 also may be used to implement the circuitry of column address and resolution control circuitry 48. In this instance, the Increment Column pin 22 clocks shift register 50, and the Decrement Column Resolution pin 30 clocks shift register 52. Similarly, the output of combinational logic 56 becomes control lines 46, for controlling DPST switches 42.

Having described illustrative circuitry for implementing the invention, the operation of that circuitry will now be described. To read sensor array 10, the circuitry is reset, and a clock pulse is applied to Increment Column pin 22 and Increment Row pin 24. This addresses the sensor site at coordinates (1,1) of the 16×16 array. Increment Column pin 22 then is pulsed fifteen times to read sequentially a pixel of data from each of the sensing elements in row 1. Next, Increment Row pin 24 is pulsed. Increment column pin 22 is then pulsed sixteen times to read each of the columns in row 2. This procedure is continued until each of the rows and columns in the array have been addressed. This procedure is implemented as often as often as necessary for a given application.

In a typical application of the invention, voltage is applied to DPST switches 42, and thus to column input pins 19 and to the columns of sensor array 10. The output feedback of op amp 38 is grounded, enabling the selective grounding of row input pins 20 through SPST analog switches 36. When force is applied to a sensing element that is selected (i.e., addressed using the procedure outlined above), current flows from voltage input pin 32, through the selected sensing element, to ground. The resistance of the sensing element can then be calculated using one of several well-known techniques, such as the voltage divider technique.

Figure 7:
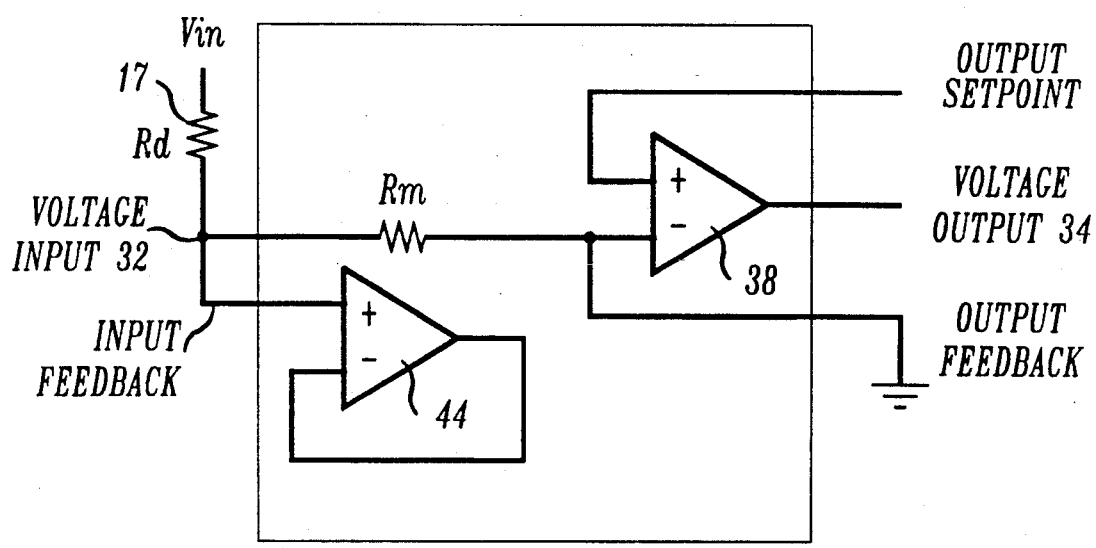
FIG. 7 is a schematic diagram of an illustrative circuit for determining the resistance of a sensing element of the sensor array of FIG. 2.

FIG. 7 shows an illustrative connection diagram of a circuit for determining the resistance (Rm) of a sensing element in sensor array 10 using the voltage divider technique. The value of Rm can be calculated from the equation, Volt-in=Vin (Rm/(Rm+Rd)). One skilled in the art will appreciate that other methods, such as the resistance bridge or inverting amplified output techniques (which take advantage of op amp 38) also may be used to determine the resistance of the sensing elements.

It will be understood that the foregoing is merely illustrative of the principles of the invention, and that various modifications can be made by those skilled in the art without departing from the scope and spirit of the invention. For example, the sensor of FIG. 1 could be replaced with a sensor having interdigitating fingers overlaid with a sheet of conductive material. Similarly, analog switches 36 and 42 could be replaced with multiplexer circuitry. The scope of this invention is limited only by the claims that follow.

I claim:

1. An apparatus for monitoring force applied to a surface and producing data in response to the monitored force, comprising:
    a force sensor having a plurality of separately-accessible force sensing elements, each of said sensing elements producing a force data output when accessed;
    means coupled to said sensor for separately accessing each of said sensing elements; and
    means for selectively electrically coupling at least two of said sensing elements to vary the spatial resolution of the sensor so that a single data output is produced by said at least two sensing elements if force is applied to any of said at least two sensing elements.

2. The apparatus of claim 1 wherein the means for separately accessing comprises:
    means for selectively applying a voltage to a first terminal of each of said sensing element; and
    means for selectively grounding a second terminal of each of said sensing elements.

3. The apparatus of claim 1, wherein said sensor comprises an array of sensing elements.

4. The apparatus of claim 1, further comprising means for preventing electrical current from flowing through sensing elements which are not currently accessed by said means for separately accessing.

5. The apparatus of claim 4, wherein said means for preventing electrical current from flowing is coupled to said means for separately accessing.

6. The apparatus of claim 1, wherein the sensor comprises a piezoresistive sensor.

7. The apparatus of claim 1, wherein the sensor comprises a variable capacitance sensor.

8. The apparatus of claim 1, wherein the sensor comprises an anisotropic material disposed between conductive elements of the sensor.

9. A circuit for selectively varying the resolution of a force sensor array which includes a plurality of force sensing elements that are separately addressable by a row and a column address to produce a force data output when addressed, comprising:
    means for selectively applying a voltage to a first terminal of at least two of said sensing elements;
    means for selectively grounding a second terminal of at least two of said sensing elements; and
    means for selectively electrically coupling at least two of said sensing elements so that a single data output is produced by said elements if a force is applied to any of said at least two sensing elements, thereby varying the spatial resolution of the sensor array.

10. The apparatus of claim 9, wherein said means for selectively electrically coupling causes the means for selectively applying a voltage to apply a voltage simultaneously to the first terminal of at least two sensing elements.

11. The apparatus of claim 9, wherein said means for selectively electrically coupling causes the means for selectively grounding to ground simultaneously the second terminal of at least two sensing elements.

12. The apparatus of claim 9, further comprising means for preventing electrical current from flowing through sensing elements not being accessed.

* * * * *